(12) United States Patent
Yun

(10) Patent No.: US 6,838,127 B2
(45) Date of Patent: Jan. 4, 2005

(54) METHOD AND APPARATUS FOR FORMING AN HSG-SI LAYER ON A WAFER

(75) Inventor: Jong Young Yun, Suwon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 39 days.

(21) Appl. No.: 10/107,062

(22) Filed: Mar. 28, 2002

(65) Prior Publication Data

US 2002/0106894 A1 Aug. 8, 2002

Related U.S. Application Data

(62) Division of application No. 09/584,766, filed on Jun. 1, 2000, now Pat. No. 6,398,873.

(30) Foreign Application Priority Data

Oct. 1, 1999 (KR) .............................. 99-42366

(51) Int. Cl.⁷ .................... C23C 16/24; C23C 16/46; C23C 16/505; C23C 16/56
(52) U.S. Cl. .................... 427/573; 427/574; 427/578; 427/248.1; 427/255.18; 427/314; 427/397.7; 118/666; 118/725; 438/488
(58) Field of Search .............................. 427/573, 574, 427/578, 248.1, 255.18, 314, 372.2, 397.7, 255.19; 118/666, 723 E, 723 I, 725; 423/348, 349; 438/255, 398, 488, 665, 964

(56) References Cited

U.S. PATENT DOCUMENTS

| | | | |
|---|---|---|---|
| 4,911,102 A | 3/1990 | Manabe et al. | |
| 5,759,864 A | 6/1998 | Cushing et al. | |
| 5,759,895 A * | 6/1998 | Tseng ........................... | 438/255 |
| 5,833,754 A | 11/1998 | Ito et al. | |
| 5,885,869 A | 3/1999 | Turner et al. | |
| 5,894,887 A | 4/1999 | Kelsey et al. | |
| 5,935,334 A | 8/1999 | Fong et al. | |
| 5,980,687 A | 11/1999 | Koshimizu | |
| 6,015,465 A | 1/2000 | Kholodenko et al. | |
| 6,055,927 A | 5/2000 | Shang et al. | |
| 6,069,053 A * | 5/2000 | Ping et al. .................. | 438/398 |
| 6,177,127 B1 * | 1/2001 | Weimer et al. ................ | 427/8 |
| 6,198,074 B1 | 3/2001 | Savas | |
| 6,270,580 B2 | 8/2001 | Vu et al. | |
| 6,273,958 B2 | 8/2001 | Shamouilian et al. | |
| 6,280,584 B1 | 8/2001 | Kumar et al. | |
| 6,332,927 B1 | 12/2001 | Inokuchi et al. | |
| 6,592,661 B1 * | 7/2003 | Thakur et al. .................. | 117/2 |
| 2001/0012697 A1 | 8/2001 | Mikata | |
| 2001/0025604 A1 * | 10/2001 | Sakai .......................... | 118/715 |
| 2001/0054385 A1 | 12/2001 | Horiguchi | |
| 2002/0025651 A1 * | 2/2002 | Takasawa et al. ........... | 438/398 |

FOREIGN PATENT DOCUMENTS

| EP | 0 845 546 A2 * | 6/1998 |
|---|---|---|
| JP | 63-196033 A | 5/1988 |

* cited by examiner

Primary Examiner—Shrive P. Beck
Assistant Examiner—Wesley D. Markham
(74) Attorney, Agent, or Firm—Volentine Francos & Whitt, PLLC

(57) ABSTRACT

An HSG-Si layer is formed on a wafer under a uniform temperature condition. An apparatus for forming the HSG-Si layer includes a housing forming a process chamber, a first heater on which the wafer is positioned fixed in place at the bottom of the process chamber, a second heater at the top of the process chamber, and a thermal insulator which prevents the heat generated by the first heater from being transferred to the outside of the process chamber. A temperature control system regulates the temperature of the heaters. A method of forming the HSG layer includes steps of placing the wafer on the first heater, using the heaters to remove moisture from the wafer, injecting a source gas of the HSG-Si toward the upper surface of the wafer to form amorphous silicon on the wafer, and annealing the wafer for a predetermined period of time to transform the amorphous silicon into an HSG-Si layer. During the steps of forming the HSG-Si layer, the temperatures of the first and second heaters are regulated to maintain the surface temperature of the wafer constant.

5 Claims, 4 Drawing Sheets

METHOD AND APPARATUS FOR FORMING AN HSG-SI LAYER ON A WAFER

This is a divisional of Application Ser. No. 09/584,766, filed Jun. 1, 2000, now U.S. Pat. No. 6,398,873, which is incorporated herein by reference in its entirety.

BACKGROUND OF THE INVENTION

1. Field of the Invention

The present invention relates to method and apparatus for forming an HSG-Si (hemispherical grained silicon) layer. More particularly, the present invention relates to a method and apparatus for forming an HSG-Si layer on a wafer in the manufacturing of semiconductor memory devices.

2. Description of the Related Art

In general, semiconductor devices are manufactured by coating a silicon wafer with a thin film having predetermined electrical characteristics, using a semiconductor manufacturing apparatus. The thin film is typically formed on the wafer by executing a series of semiconductor processes such as lithography, chemical and physical vapor deposition, plasma etching, HSG-Si manufacturing processes or the like. The wafer coated with the thin film is used for manufacturing semiconductor devices and chips.

Among the above-mentioned semiconductor manufacturing processes, the HSG-Si manufacturing process is widely used to increase the surface area of a capacitor, thereby increasing the capacitance. HSG-Si is commonly manufactured by depositing silicon under a predetermined deposition condition or by depositing amorphous silicon and transforming the silicon into HSG-Si. These types of HSG-Si manufacturing methods are disclosed in U.S. Pat. No. 5,885,869 (issued to Charles Turner et al. on Mar. 23, 1999) and U.S. Pat. No. 5,759,895. (issued to Horng-Huei Tseng et al. on Jun. 2, 1998).

FIG. 1 shows a semiconductor processing system 500 for carrying out a conventional HSG-Si manufacturing process. As shown in FIG. 1, the conventional semiconductor processing system 500 includes a process chamber 510. A first heater 520 for heating a wafer 400 is installed in the process chamber 510. The lower surface of the first heater 520 is supported by a support member 522. The wafer 400 is introduced in the process a chamber 510 through a guide slot 514 formed on one side of the process chamber 510, and is positioned on the first heater 520.

A thermocouple 525 for detecting the temperature of the first heater 520 and a current supplying line 523 for supplying a current to the first heater 520 are provided beneath the first heater 520. The thermocouple 525 and the current supplying line 523 are connected to a controller (not shown). The controller supplies the current to the first heater 520 through the current supplying line 523 based on the temperature of the first heater 520 detected by the thermocouple 525, thereby maintaining the temperature of the first heater 520 within a predetermined range.

The wafer 400 is fed into the process chamber 510 by a handler (not shown), and a control section (not shown) operates a valve device 516 to open/close the guide slot 514 so that the wafer 400 can be guided into the process chamber 510.

The process chamber 510 includes a dome-shaped roof 512, and a second heater 521 is installed on an upper portion of the dome-shaped roof 512 in such a manner that it surrounds the dome-shaped roof 512. The radiant heat created in the process chamber 510 by the first and second heaters 520 and 521 is directed to the wafer 400 by the dome-shaped roof 512.

An RF (Radio Frequency) electrode 540 to which an RF current is applied is installed between the dome-shaped roof 512 and the second heater 521. When a gas such as silane, disilane, or the like is injected from a gas injector 530, RF electric waves are irradiated into the process chamber 510 through the RF electrode 540 to activate the gas. The gas injector 530 is connected to a gas supplying line 538, and the gas is supplied to the gas injector 530 through the gas supplying line 538 from a gas source (not shown).

One side of the process chamber 510 communicates with a discharging port 532. The discharging port 532 is connected to a vacuum pump 535 so that a vacuum can be created in the process chamber 510.

A wafer holder 560, which receives the wafer 400 guided toward first heater 520 and places the wafer 400 on the upper surface of the first heater 520, is installed in the process chamber 510. The wafer holder 560 includes a first arm portion 562 disposed at a peripheral portion of the upper surface of the first heater 520, a second arm portion 564 engaged with a wafer holder driving apparatus 570, and a support 566 connecting the first arm portion 562 and the second arm portion 564. Although only one first arm portion 562, one second arm portion 564, and one support 566 are shown in FIG. 1, the wafer holder 560 comprises three or more sets of such components.

The wafer holder driving apparatus 570 comprises a cylinder 572 provided below the process chamber 510. A bellows 580 provides a seal between the cylinder 572 and the process chamber 510 so that the vacuum state of the process chamber 510 is maintained.

A plunger 574 is disposed in the cylinder 572 and is movable in upward and downward directions. A shaft 576 is engaged with the upper surface of the plunger 574, and the upper end portion of the shaft 576 is engaged with the end portion of the second arm portion 564. A hydraulic pressure supplying section 578 supplies hydraulic pressure to the cylinder 572 to move the plunger 574 in the cylinder 572.

In addition, the conventional semiconductor processing system 500 includes a heater moving apparatus 600 for moving the first heater 520 upward and downward. The heater moving apparatus 600 comprises a motor 608 generating a driving force and a lift 610 which is connected to the motor 608 in such a manner that it can move up and down.

The lift 610 is fixed to the lower surface of a bellows cover 620, and moves the bellows cover 620 upward and downward when the motor 608 is operated. The bellows cover 620 includes an upper cover 622 fixedly attached to the bottom of the process chamber 510 and a lower cover 624 which is moved upward and downward by the lift 610. When the lift 610 is moved upward, the upper cover 622 is maintained in a fixed state and the lower cover 624 is moved into the upper cover 622. Further, the support member 522 of the first heater 520 is mechanically connected to the lower cover 624 so as to move together with the lower cover 624, so that the first heater 520 can be moved upward and downward in the process chamber 510.

Hereinafter, the operation of the of the above-described conventional semiconductor processing system 500 for manufacturing an HSG-Si will be explained.

When the HSG-Si manufacturing process starts, the valve device 516 opens the guide slot 514 whereupon the wafer 400 is moved into the process chamber 510 by the handler. When the wafer 400 has been moved into a position over the upper surface of the first heater 520, the wafer holder 560 is moved upward by the wafer holder driving apparatus 570 to receive the wafer 400, and then is moved downward to position the wafer 400 on the upper surface of the first heater 520. At the same time, the controller applies operation signals to the first and second heaters 520 and 521 so as to operate the first and second heaters 520 and 521. At this time, the temperature of the first heater 520 is about 700 to 750° C., the temperature of the second heater 521 is about 315 to 325° C., and the temperature of the wafer 400 is about 600 to 610° C.

Then, the controller applies operation signals to the heater moving apparatus 600 in order to move the first heater 520 upward to a fust position A in the process chamber 510. Placing the first heater 520 at the first position A in the process chamber 510 improves the efficiency of heating the wafer 400. At the first position A the first heater 520 is at a level corresponding to that of the gas injector 530, and is vertically displaced upwardly from its initial position by about 80 mm.

At this time, the temperatures of the first and second heaters 520 and 521 are maintained constant, but the temperature of the wafer 400 is raised to 615–625° C. due to the heat radiating in the process chamber 510.

Thereafter, the first heater 520 is left at the first position A for about one minute. The time period of one minute is required for removing foreign substances such as moisture from the wafer 400.

After one minute has passed, a gas is injected on the wafer 400. The gas acts as a source for forming HSG-Si on the wafer 400, and for this purpose a reactive gas such as silane or disilane or the like is used. Then, the RF current is applied to the RF electrode 540 so that the RF electric waves are irradiated into the process chamber 510, to activate the source gas.

When the gas injecting process has been completed, the controller operates the heater moving apparatus 600 to move the first heater 520 upward to a second position B in the process chamber 510. Placing the first heater 520 to the second position B in the process chamber 510 accelerates the growth rate of the HSG-Si by raising the temperature of the wafer 400.

At the second position B, the first heater 520 is displaced vertically upward from its initial position by about 100 mm. At this time, the heating temperatures of the first and second heaters 520 and 521 remain constant, but the temperature of the wafer 400 is raised to 625–635° C. by the heat radiating in the process chamber 510. The gas injected on the wafer 400 is thermally decomposed when the heater 520 is at the second position B, whereby the HSG-Si layer is formed on the wafer 400.

After the formation of the HSG-Si layer has been completed, the controller operates the heater moving apparatus 600 to return the first heater 520 to its initial position, and then opens the valve device 516. Then the handler moves into the process chamber 510 and feeds the wafer 400 to the next stage of the semiconductor device fabrication equipment.

However, in the conventional semiconductor processing system 500, the temperature in the process chamber 510 varies as the first heater 520 is moved in the process chamber 510 while the HSG-Si process is proceeding. As it is known that HSG-Si forms best under a uniform temperature condition, the unstable temperature condition occurring due to the movement of the first heater 520 can produce defects in the HSG-Si layer.

Furthermore, the heater moving apparatus 600 for moving the first heater 520 upward and downward renders the overall structure of the apparatus complex, and contributes significantly to the manufacturing cost of the apparatus.

Furthermore, moving the first heater 520 upward and downward during the forming of the HSG-Si layer takes time, thereby detracting from the productivity of the manufacturing process.

SUMMARY OF THE INVENTION

The present invention has been made to solve the above-described problems.

Accordingly, one object of the present invention is to provide a method of forming an HSG-Si layer in a relatively short amount of time and under a uniform temperature condition, thereby preventing defects from occurring in the HSG-Si layer and contributing to the overall efficiency and productivity of a semiconductor device manufacturing process. Another object of the present invention is to provide an apparatus of a relatively simple structure for forming an HSG-Si layer under a uniform temperature condition, thereby preventing defects from occurring in the HSG-Si layer and reducing equipment costs associated with a semiconductor device fabrication facility.

In order to achieve the first object, the present invention provides a method of forming an HSG-SI layer wherein the temperature of the ambient in a process chamber is maintained constant by regulating the temperature of a first heater fixed in place at the bottom of the process chamber and a second heater surrounding the upper portion of the process chamber. A wafer having a silicon layer is placed on a central portion of the first heater and foreign substances are removed from the wafer by using the first and second heaters and the heat radiating within the process chamber. Thereafter, a source gas is injected onto the silicon layer of the wafer and the wafer is annealed for a predetermined time, while the first heater remains fixed in place and temperatures of the heaters are regulated to maintain the surface temperature of the wafer constant, so that a uniform HSG-Si layer is formed from the silicon layer.

In order to achieve the second object, the present invention provides a semiconductor processing apparatus having a housing constituting a process chamber in which the HSG-Si manufacturing process is performed, a first heater fixed in place at the bottom of the process chamber, a gas injector disposed at the same level as the first heater, and a thermal insulator which insulates the process chamber to prevent the loss of heat from the process chamber.

A second heater for raising the temperature in the process chamber may be provided at the top of the process chamber. The upper portion of the housing constituting the process chamber is preferably dome-shaped so that the heat radiating from the first heater is directed toward the wafer.

A temperature control system allows the temperature of the first and second heaters and, hence, the temperature of the ambient within the process chamber and the surface temperature of the wafer itself, to be regulated. The temperature control system includes at least one temperature sensor, such as a thermocouple, and a current supply line attached to the first heater.

The gas injector injects a gas onto the upper surface of the wafer positioned on the first heater so that an HSG-Si layer can be grown on a silicon layer of the wafer. An RF electrode may be provided between the upper portion of the process chamber and the second heater. RF electric waves are irradiated into the process chamber when the gas is injected toward the upper surface of the wafer, thereby activating the gas.

The insulator preferably includes a quartz member extending over the inner surface of a wall of the housing at the lower portion of the process chamber. The wall has an interior space, which is preferably in the state of a vacuum to prevent the transfer of heat from the inner wall surface at the bottom of the process chamber to the outer wall surface at the bottom of the process chamber.

BRIEF DESCRIPTION OF THE DRAWINGS

The above and other objects, features and advantages of the present invention will become more apparent from the following detailed description thereof made with reference to the accompanying drawings, of which.

DETAILED DESCRIPTION OF THE PREFERRED EMBODIMENT

Hereinafter, a preferred embodiment of the present invention will be explained in detail with reference to the attached drawings.

Figure 1:
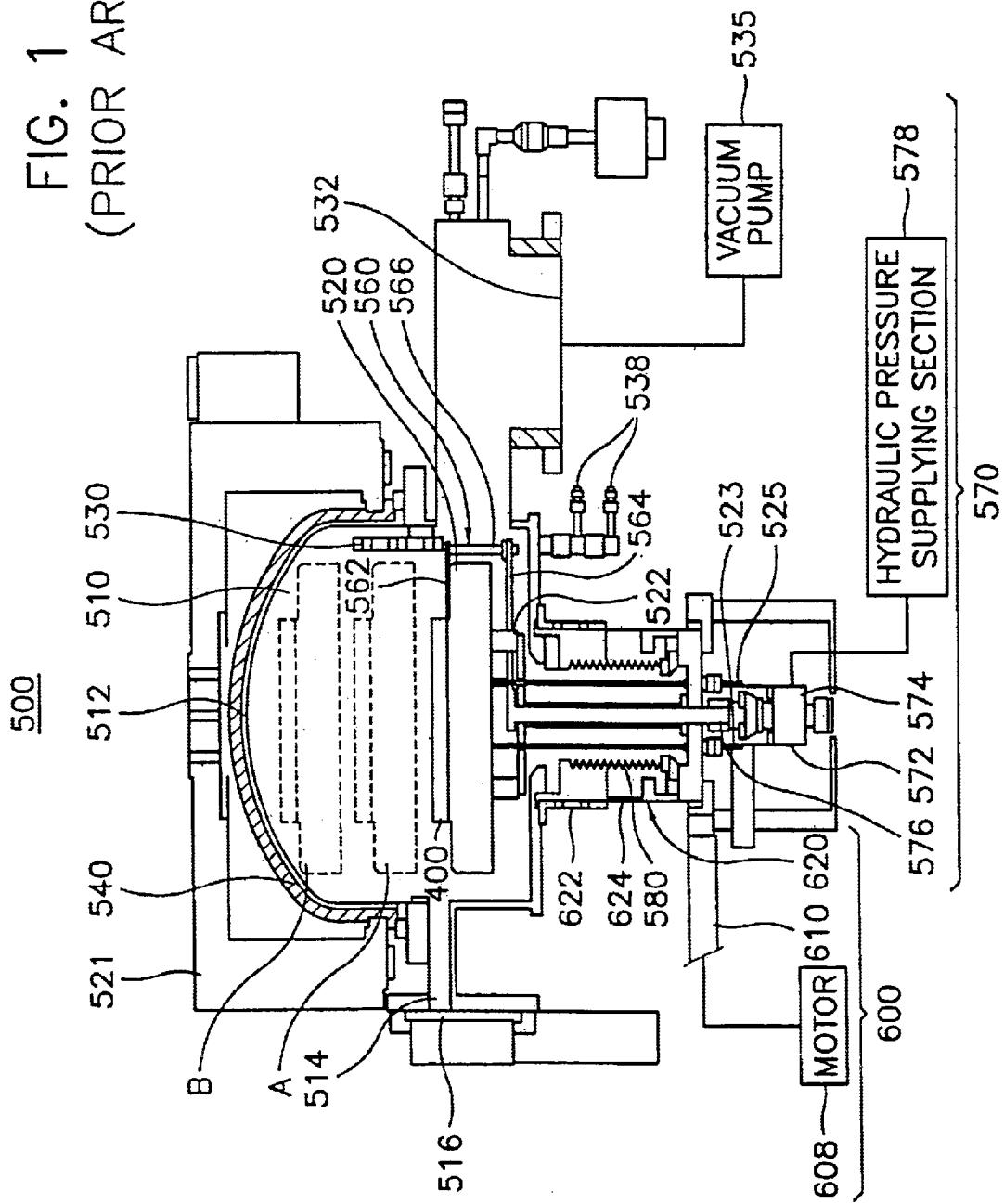
FIG. 1 is a schematic diagram of a conventional semiconductor processing system used to form an HSG-Si layer on a wafer.
Figure 2:
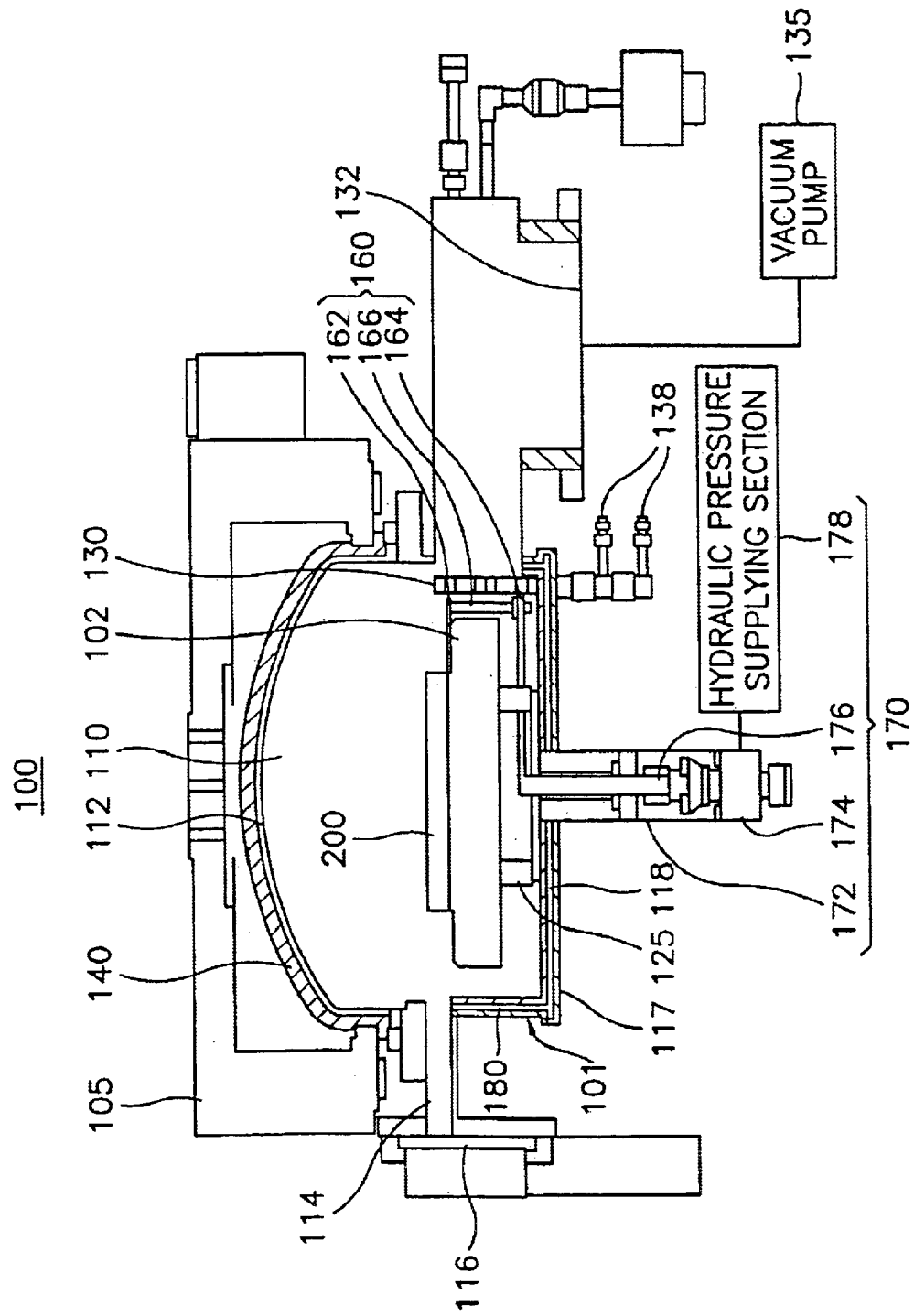
FIG. 2 is a schematic diagram of a semiconductor processing system used to form an HSG-Si layer on a wafer according to the present invention.

Referring to FIG. 2 an apparatus 100 for forming an HSG-Si layer on a wafer according to the present invention includes a housing 101 forming a process chamber 10 therein. The housing 101 includes a bottom wall 17 extending along the bottom of the process chamber 110.

A first heater 102 for heating a wafer 200 is fixed in place in the process chamber 110. More specifically, the bottom surface of the first heater 102 is supported by a support member 125 fixed to the bottom wall 117 of the housing 101. The wafer 200 is introduced into the process chamber 110 through a guide slot 114 formed at one side of the process chamber 110 and is positioned on the upper surface of the first heater 102.

Figure 3:
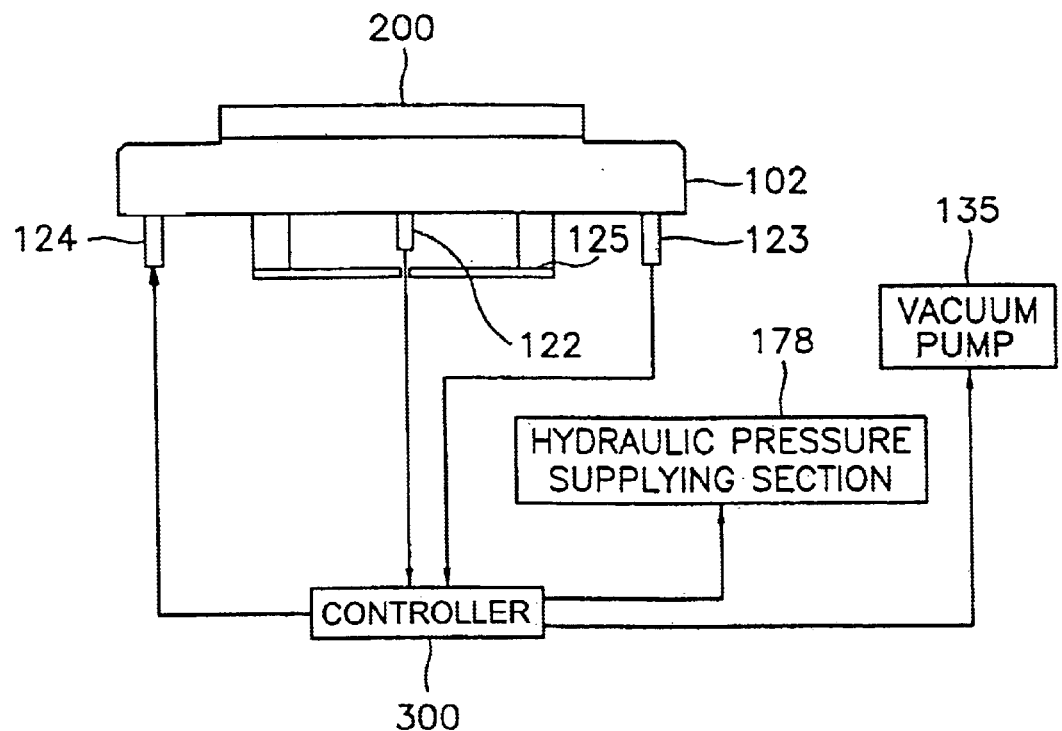
FIG. 3 is a schematic diagram of a portion of the semiconductor processing system comprising a thermocouple and a power supplying line installed on the bottom of a heater.

Referring to FIG. 3, first and second thermocouples 122 and 123 for detecting temperatures of the central and peripheral portions of the first heater 102 and a current supplying line 124 for supplying a current to the first heater 102 are attached to the bottom surface of the first heater 102. The first thermocouple 122 is attached to a central portion of the bottom surface of the first heater 102 and extends downwardly therefrom, and the second thermocouple 123 is attached to the peripheral portion of the bottom surface of the first heater 102 at one side thereof and extends downwardly therefrom.

The first and second thermocouples 122 and 123 and current supplying line 124 are connected to a controller 300. The controller 300 supplies a current to the first heater 102 through the current supplying line 124 based on the temperature of the first heater 102 detected by the first and second thermocouples 122 and 123 so that the temperature of the first heater 102 is maintained within a predetermined range.

It is preferable that the temperature of the first heater 102 is maintained at a temperature of from 700 to 750° C. More particularly, the controller 300 maintains the temperature of the central portion of the first heater 102 at 700 to 710° C. based on the temperature data inputted from the first thermocouple 122 and maintains the temperature of the peripheral portion of the first heater 102 at 740 to 750° C. based on the temperature data inputted from the second thermocouple 123. Here, the central portion of the first heater 102 refers to that portion on which the wafer 200 is positioned. Because the temperature of the central portion of the first theater 102 is lower than the temperature of the peripheral portion of the first heater 102, and the peripheral portion of the first heater 102 is disposed remotely from the wafer 200, the effect that the peripheral portion of the first heater 102 has on heating the wafer is less than the effect that the central portion of the first heater 102 has.

The central portion of the first heater 102 protrudes upwardly by a predetermined distance from the upper surface of the peripheral portion of the first heater 102. As such, a wafer holder 160 (shown in FIG. 2) can be positioned on the periphery of the upper surface of the first heater 102.

Figure 4:
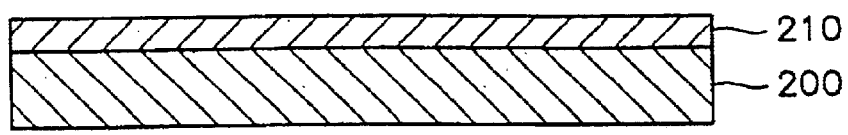
FIG. 4 is a cross-sectional view of a wafer fed into a process chamber.

As shown in detail in FIG. 4, a silicon layer 210 is formed on the upper surface of the wafer 200 which is positioned on the first heater 102. The wafer 200 formed with the silicon layer 210 is fed into the process chamber 110 by a handler (not shown), and the control section 300 operates a valve device 116 (shown in FIG. 2) to open the guide slot 114 so that the wafer 200 can be easily guided into the process chamber 110.

Referring again to FIG. 2, the process chamber 110 includes a dome-shaped roof 112. A second heater 105 surrounding the dome-shaped roof 112 is disposed at an upper portion of the dome-shaped roof 112. The radiant heat in the process chamber 110 is efficiently directed toward the wafer 200 by the dome-shaped roof 112.

The temperature of the second heater 105 is controlled by the controller 300. The controller 300 controls the temperature of the second heater 105 to within a range of 300 to 320° C. The controller 300 also controls the temperatures of the first and second heaters 102 and 105 such that the surface temperature of the wafer 200 is maintained within a range of 625 to 630° C. considering also the heat radiating toward the wafer in the process chamber 110. For this purpose, the temperatures of the second heater 105 and the process chamber 110 are inputted to the controller 300 by a sensor device (not shown).

The apparatus 100 also includes an RF electrode 140 disposed between the dome-shaped roof 112 and the second heater 105. When a gas such as silane, disilane, or the like is injected from the gas injector 103, RF electric waves are irradiated into the process through the RF electrode 140, thereby activating the gas. The gas injector 130 is installed at the same level (with respect to the vertical) as the first heater 102 and is connected to a gas supplying line 138 for receiving the gas from a supply of source has (not shown).

Furthermore, the apparatus 100 according to the present invention includes an insulating member 180 which insulates the interior of the process chamber 110 from the environment outside the process chamber 110 so that the heat in the process chamber 110 is prevented from transferring to the outside of the process chamber 110. The insulating member 180 covers the inner wall surface of the bottom portion of the process chamber 110. The insulating member 180 is of quartz.

A space 118 is formed in the bottom wall 117 of the process chamber 110. The space 118 is in a vacuum state to prevent heat from being transferred from the inner wall surface of the bottom of the process chamber 110 to the outer wall surface of the bottom of the process chamber 110. According to another form of the present invention, an insulating material such as quartz can occupy the space 118.

The vacuum within the space 18 reduces the temperature loss in the process chamber 110 so that the temperature in the process chamber 110 is stably maintained, and prevents the outer wall of the process chamber 110 from becoming hot, thereby protecting operating personnel.

One side of the process chamber 110 communicates with a discharge port 132. The discharge port 132 is connected to a vacuum pump 135 controlled by the controller 300 to allow the process chamber 110 to be evacuated.

In the process chamber 110, the wafer holder 160 receives the wafer 200 guided toward the first heater 102 in order to place the wafer 200 on the upper surface of the first heater 102. The wafer holder 160 includes a first arm portion 162 disposed at a peripheral portion of the upper surface of the first heater 102, a second arm portion 164 connected to a wafer holder driving apparatus 170, and a support 166 which connects the first arm portion 162 to the second arm portion 164. Although only one first arm portion 162, one second arm portion 164, and one support 166 are shown in the figure, the wafer holder comprises three or more sets of such components.

The wafer holder driving apparatus 170 comprises a cylinder 172 integral with and disposed at the central portion of the bottom of the process chamber 110.

A plunger 174 is disposed in the cylinder 172 in such a manner that it can move upward and downward. An operation rod 176 is engaged with the upper surface of the plunger 174 and the upper end portion of the operation rod 176 is connected to an end of the second arm portion 164. A hydraulic pressure supplying section 178 controlled by the controller 300 supplies the cylinder 172 with hydraulic pressure to cause the plunger 174 to move upward and downward in the cylinder 172.

Figure 6:
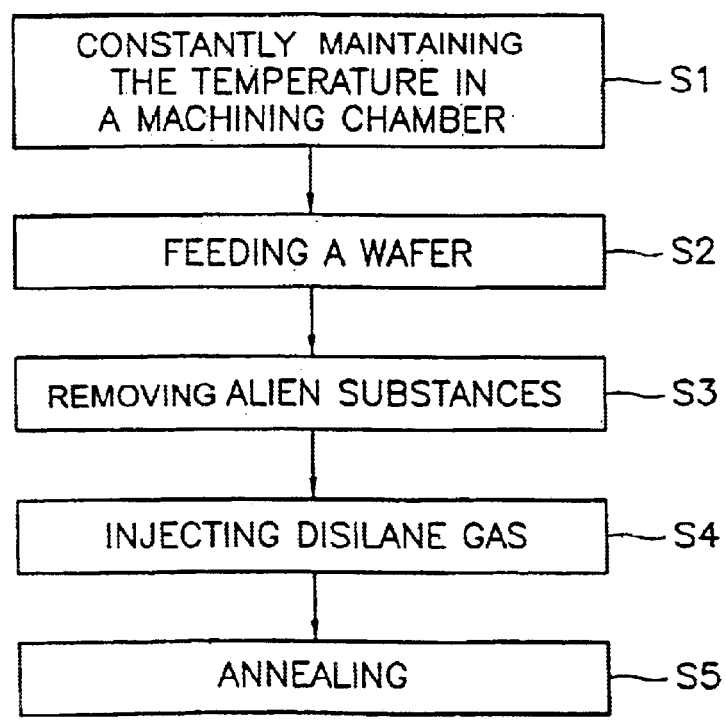
FIG. 6 is a flow chart of an HSG-SI manufacturing process according to the present invention.

Hereinafter, the operation of the HSG-Si layer forming apparatus 100 of the present invention will be described with reference to FIG. 6.

When the HSG-Si manufacturing process starts, the controller 300 causes current to be supplied to the first heater 102 fixed in place in the process chamber 110 and to the second heater 105 surrounding the upper portion of the process chamber 110 until the temperature in the process chamber 110 reaches a constant value (Step S1). Then, the controller 300 regulates the temperature of the first heater 102 so as to be within a range of 700 to 750° C. and regulates the temperature of the second heater 105 so as to be within a range of 300 to 320° C.

Thereafter, the valve device 116 is commanded by signals received from the controller 300 to open the guide slot 114 whereupon the wafer 200 is moved into the process chamber 110 by the handler.

When the wafer 200 is moved to a position over the upper surface of the first heater 102, the first arm portion 162 of the wafer holder 160 positioned on the peripheral portion of the upper surface of the first heater 102 is moved upwardly by the wafer holder driving apparatus 170 and thereby receives the wafer 200. The first arm portion 162 is then moved downward and places the wafer 200 on the central portion of the upper surface of the first heater 102 (Step S2).

The wafer 200 remains there in a stationary state (is fixed on the first heater 102) for a predetermined time (Step S3). During this time foreign substances, such as moisture formed on the wafer 200, are removed by the heat generated by the first and second heaters 102 and 105 and the radiant heat in the process chamber 110. At this time, the temperature of the wafer 200 is maintained within the range of 625 to 630° C.

Thereafter, gas is injected onto the silicon layer of the wafer 200 by gas injector 130 to form amorphous silicon (Step S4). The gas is a source gas of the amorphous silicon, such as silane, disilane, trisilane, and dichlorosilane. During this injecting step, the RF electric waves are irradiated into the process chamber 10 by the RF electrode 140 to activate the gas. The gas injected onto the wafer 200 is thermally decomposed, thereby forming the amorphous silicon layer on the wafer 200. The amorphous silicon layer is formed on the wafer 200 by rapid thermal chemical vapor deposition or low pressure chemical vapor deposition.

Figure 5:
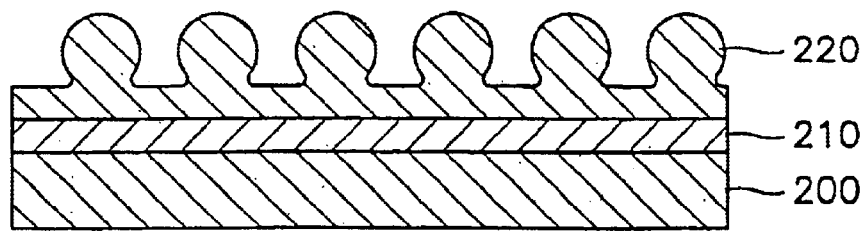
FIG. 5 is a cross-sectional view of the wafer showing an HSG-Si layer formed on the wafer.

Thereafter, the wafer 200 is annealed for a predetermined time so that the amorphous silicon layer formed on the upper portion of the silicon layer is transformed into an HSG-Si layer (Step S5). The HSG-Si layer 220 is shown in FIG. 5.

During Steps S1 to S5, the temperature in the process chamber 110 and the temperatures of the first and second heaters 102 and 105 are detected by the sensor device and the first and second thermocouples 122 and 123. Also, during Steps S3 to S5, the controller 300 finely controls the amount of current supplied to the first and second heaters 102 and 105 based on the detected temperatures to thereby maintain the temperature of the wafer 200 within a range of 625 to 630° C.

In addition, during Steps S1 to S5, the temperature in the process chamber 110 is maintained constant, whereby the temperature of the wafer 200 is also maintained constant (from 625 to 630° C.).

When the formation of the HSG-Si layer 220 has been completed, the controller 300 opens the valve device 116 and applies operation signals to the handler to feed the wafer 200 to the next stage of the semiconductor fabrication equipment.

As described above, the HSG-Si layer can be uniformly formed on the wafer according to the present invention, because the temperature in the process chamber is maintained constant during the HSG-Si manufacturing process. Furthermore, the HSG-Si layer forming apparatus has a comparatively small number of working parts and hence, a correspondingly simple structure. Thus, it is economical to manufacture. Still further, the present invention can form the MSG-Si layer in less time than the prior art, and thus contributes to the efficiency in the manufacturing process of the semiconductor devices.

Although the present invention has been described above in connection with the preferred embodiment thereof, it is to be understood that various changes and modifications can be made to the present invention within the spirit and scope of the present invention as defined by the appended claims.

What is claimed is:

1. A method of forming an HSG-Si layer on a wafer, said method comprising:
   providing a process chamber having a first heater fixed in a position at a bottom thereof and a second heater located at a top thereof, the first heater having a central portion that protrudes upwardly relative to a peripheral portion thereof;

placing the wafer onto the central portion of the first heater fixed in said position at the bottom of the process chamber;

with the wafer disposed on the central portion of the first heater, operating the first and second heaters and exposing the wafer to heat generated by the first and second heaters and radiating within the process chamber for a period of time sufficient for the heat to remove foreign substances from the wafer;

once the period of time has elapsed, injecting a source gas of HSG-Si onto the wafer supported on the central portion of the first heater while the first heater remains fixed in said position at the bottom of the process chamber, to thereby form a layer of amorphous silicon on the wafer;

with the first heater still fixed in said position at the bottom of the process chamber, annealing the wafer for a predetermined period of time so that the amorphous silicon is transformed into an HSG-Si layer, and regulating the temperatures of the central and peripheral portions of the first heater independently of one another such that the temperature of the central portion of the heater on which the wafer is situated is lower than the temperature of the peripheral portion of the heater, and regulating the temperature of the second heater to maintain the temperature of the wafer constant from at least once the source gas begins to be injected into the process chamber through the end of the annealing at the lapse of said predetermined period of time.

2. The method of forming an HSG-Si Layer on a wafer as claimed in claim 1, wherein the step of said regulating of the temperatures of the heaters comprises maintaining the temperature of the ambient within the process chamber constant from the time the wafer is placed on the central portion of the first heater through the end of the annealing at the lapse of said predetermined period of time.

3. The method of forming an HSG-Si layer on a wafer as claimed in claim 1, wherein the top of said regulating of the temperatures of the heaters comprises regulating the temperature of the central portion of the first heater to within a range of 700 to 710° C., the temperature of the peripheral portion of the first heater to within a range of 740 to 750° C. and the temperature of the second heater to within a range of 300 to 320° C., and adjusting the temperatures of the first and second heaters within said ranges from once the source gas begins to be injected into the process chamber through the end of the annealing at the lapse of said predetermined period of time to maintain a surface temperature of the wafer within a range of 625 to 630° C.

4. The method of forming an HSG-Si layer on a wafer as claimed in claim 1, wherein said injecting of the source gas toward the wafer comprises injecting a gas selected from the group consisting of silane, disilane, trisilane, and dichlorosilane, and further comprising irradiating RF electric waves into the process chamber to activate the gas as the gas is being injected toward the wafer.

5. The method of forming an HSG-Si layer on a wafer as claimed in claim 1, wherein the step of said regulating of the temperatures of the heaters comprises directly detecting the temperatures of the central and peripheral portions of the first heater and the temperature of the second heater heaters from the time the wafer is placed on the upper surface central portion of the first heater through the end of the annealing at the lapse of said predetermined period of time, and regulating the temperatures of the first and second heaters based on the detected temperature to maintain the surface temperature of the wafer within a range of 625 to 630° C. from at least once the source gas begins to be injected into the process chamber through the end of the annealing at the lapse of said predetermined period of time.

* * * * *